United States Patent [19]
Dill et al.

[11] 4,171,871
[45] Oct. 23, 1979

[54] ACHROMATIC UNIT MAGNIFICATION OPTICAL SYSTEM

[75] Inventors: Frederick H. Dill, South Salem; Raymond E. Tibbetts, Mahopac; Janusz S. Wilczynski, Ossining, all of N.Y.

[73] Assignee: International Business Machines Corporation, Armonk, N.Y.

[21] Appl. No.: 811,754

[22] Filed: Jun. 30, 1977

[51] Int. Cl.² ............................................. G02B 17/08
[52] U.S. Cl. .................................. 350/199; 350/202
[58] Field of Search .................... 350/199, 201, 202

[56] References Cited

U.S. PATENT DOCUMENTS 2,742,817   4/1956   Altman ............................ 350/199
3,536,380  10/1970   Ferguson ........................ 350/199

FOREIGN PATENT DOCUMENTS 396662  12/1973  U.S.S.R. ........................... 350/201

*Primary Examiner*—Paul A. Sacher
*Attorney, Agent, or Firm*—Ronald L. Drumheller

[57] ABSTRACT

A unit magnification optical system having micron resolution capability over a broad frequency spectrum. A spherical concave mirror is used to provide unit magnification at high numerical aperture with respect to object and image planes which are both located at or in the proximity of the center of curvature of the mirror, or the optical equivalent thereof. A first refractory element optically close to the object and image planes corrects longitudinal chromatic aberration of the principal rays while a second refractory element optically close to the mirror corrects residual longitudinal chromatic aberration of the marginal rays. In the preferred embodiment, a double prism arrangement located between the first refractory element and the center of curvature of the mirror optically reflects the object and image planes to parallel opposed positions having a common axis perpendicular to the axis of the mirror. The system may be used for either step-and-repeat or scanning exposure operations in fabricating microcircuits.

12 Claims, 19 Drawing Figures

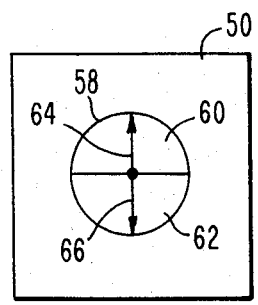
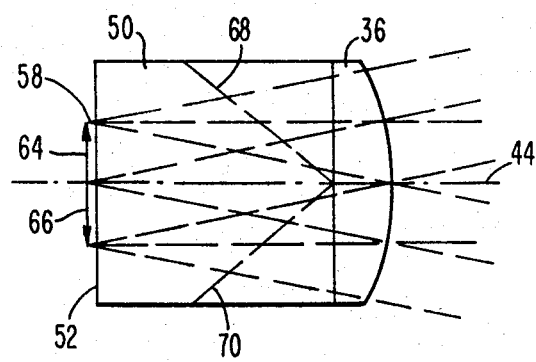
FIG. 3A
FIG. 3B
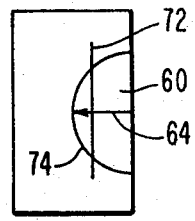
FIG. 4C
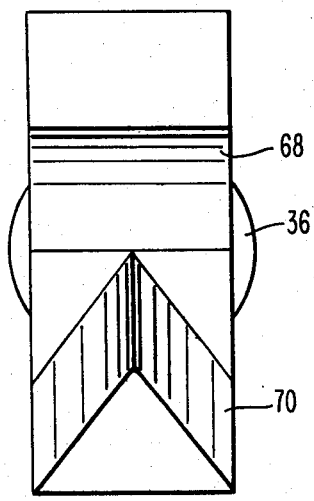
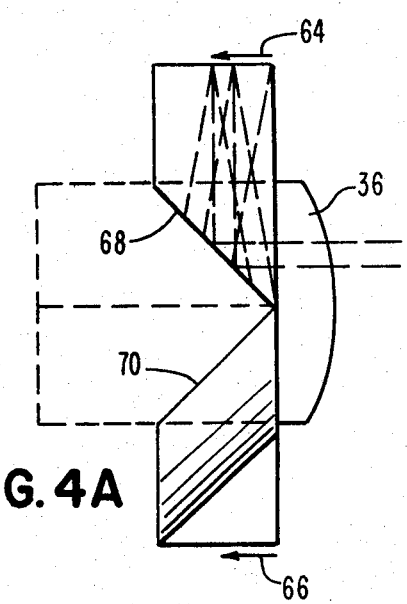
FIG. 4A
FIG. 4B
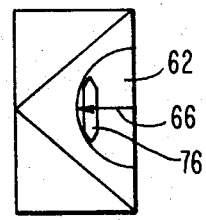
FIG. 4D

ACHROMATIC UNIT MAGNIFICATION OPTICAL SYSTEM

BACKGROUND OF THE INVENTION

1. Field of the Invention

This invention relates to optical systems for forming distortionless images having microscopically fine geometries and more particularly relates to a unit magnification catadioptric imaging system having micron resolution capability over a broad frequency spectrum for use in fabricating microcircuits.

2. Description of the Prior Art

In fabricating microcircuits a silicon slice or wafer is coated with a photoresist, exposed to a light pattern formed by one or more masks and subjected to processing steps. This sequence is repeated many times to build up microcircuits on the wafer. A wafer is typically 75 or 100 mm diameter and has many hundreds or thousands of individual identical circuits formed on it having lines of one to two microns in width. Successive masks need to be positioned with micron precision. Individual circuit masks are generally produced by photographic reduction from larger master drawings or masks. Masks containing an array of identical circuits are produced from a drawing or mask containing only one such circuit with a step-and-repeat camera system.

The final transfer of the pattern to the wafer is typically done by contact printing. Contact masks are inherently difficult to register or align properly and furthermore readily become damaged or worn from the contact. Thus, projection printing is better for the final transfer if the masks and optical system have sufficient resolution capability. If projection printing is used for the final transfer, it is also possible to perform the step-and-repeat operation at this stage. However, there are stringent optical requirements. For good linewidth production, the minimum modulation required is about 60%. For one micron lines this requires a numerical aperture of about 0.30 and an optical system which is aberration corrected so well that it is diffraction limited. It is furthermore desirable to have such correction over a wide spectral range so that alignment may be done at a visual frequency to which the photoresist is insensitive while the exposure may be done at a much shorter wavelength, typically in the near ultraviolet region, where sharper edges and corners are obtained in the pattern. Since it is difficult to mechanically assure that each successive mask and wafer alignment will be at exactly the predetermined focal settings, it is also desirable that the projection system should be telecentric in both image and object space, which means it should be a unit magnification telescope.

Optically produced masks already have rounded edges and corners at a linewidth of one micron due to the loss of higher harmonics. This deficiency can be compensated for in the optical system by increasing the numerical aperture (N.A.) to perhaps 0.70, but then the field covered as a result would be so small that the system would be impractical. Electron beam produced masks of better quality have sufficiently sharp edges and corners and will be preferred in this application.

Conventional dioptric systems are capable of providing micron resolution but only at a single wavelength and at substantial complexity if a larger field is desired. A typical 5× high performance lens system, for example, has about 11 elements of 60 to 90 mm diameter for a 10×10 mm field. A similar lens construction for unity magnification would be totally impractical since the lens system would now have to provide the same NA on both the image and the object sides leading to about 20 to 22 glass elements. A further disadvantage of conventional dioptric systems is that variations with frequency of Seidel aberrations and higher order aberrations cannot be corrected, which results in having a substantial secondary spectrum.

Catoptric systems do not have chromatic aberration at all and no secondary spectrum. A unit magnification high resolution catoptric system is described, for example, in U.S. Pat. No. 3,748,015. A two mirror system of this type is commercially available from the assignee of this patent, the Perkin-Elmer Corporation, but the N.A. is only about 0.167. This results in resolution capability sufficient to produce linewidths of only about 2.5 to 3.0 microns. The resolution capability of this system may be slightly improved but for linewidths below 2.0 microns the mechanical tolerances on motion, depth of focus and mirror stability and quality are beyond the state-of-art.

Unit magnification catadioptric systems have also been proposed. The simplest such system, a 1:1 flat field telescope, was discussed by Dyson in 1959 (49 J. Opt. Soc. Amer. 713). The simple Dyson system appears herein as FIG. 1 and consists of a plano-convex lens concentric with a spherical mirror. The plane surface of the lens intersects the center of curvature and is therefore imaged inverted onto itself. Dyson used one half of the plane surface to image onto the other half. In U.S. Pat. No. 3,536,380 a beam-splitting semi-reflecting surface has been added to enable the object and image planes to be separated without sacrificing field size. The Dyson system and various improvements thereon are described by C. G. Wynne in "A Unit-Power Telescope for Projection Copying", published by Oriel Press Limited in *Optical Instruments and Techniques*, pages 429–434, edited by J. H. Dickson (1970). Wynne suggests compounding the plano-convex lens into a onomeniscus and a plano-convex lens to correct aberrations in the system. By suitable choice of glasses and dispersions, Wynne notes that either the variation with frequency of Petzval sum or the Seidel spherical aberration can be corrected, but not both. So it was suggested that the Seidel spherical aberration not be fully corrected but instead balanced across the field against the departure from exact Petzval condition.

The inventors have discovered that the Wynne configuration cannot be corrected as well as believed. Even when more meniscus lenses are compounded to the front of the plano-convex lens to obtain more degrees of freedom and better correction, there is still an unacceptably large chromatic variation in astigmatism and Petzval sum. The more dominant need to correct Seidel spherical aberration seems to necessarily leave a chromatic variation in astigmatism and Petzval sum which cannot be well corrected by adding more degrees of freedom to the compound plano-convex lens structure in classical manner. It was surprisingly discovered that the source of the difficulty is in not correcting the lateral chromatic aberration. Presumably this aberration does not need to be corrected because the symmetry of the 1:1 telescope causes the lateral chromatic aberration introduced by the lens structure in the path going to the mirror to be exactly cancelled by the lateral chromatic aberration introduced by the lens structure in the path coming from the mirror. The mirror itself of course causes no chromatic aberration at all. However, even though the lateral chromatic aberration cancels itself in a symmetric system, it still results in a variation in path length with frequency, which leads to a chromatic variation in astigmatism and Petzval sum.

SUMMARY OF THE INVENTION

It is an object of this invention to provide a unit magnification telecentric projection system having diffraction limited resolution capability over a broad frequency spectrum.

Another object is to provide a projection system which will faithfully reproduce the fine geometrics of a microcircuit.

Still another object is to provide a telecentric projection system which is corrected over a broad frequency spectrum for longitudinal and lateral chromatic aberration as well as for chromatic variation of astigmatism and Petzval sum.

A further object is to correct lateral chromatic aberration in a symmetrical optical system to reduce chromatic variation of astigmatism and Petzval sum.

It is also an object to provide a microcircuit projection system which may be aligned in the green part of the frequency spectrum and exposed in the near UV part with no refocussing required.

Another object is to provide a microcircuit projection system where parity is obtained between the mask and wafer, thereby facilitating scanning operation.

A further object is to provide a projection system which may be used for either step-and-repeat or scanning exposure operations in fabricating microcircuits.

Still another object is to provide a practical Dyson system which is corrected for wavelengths between 3650 A and 5461 A or broader to such an extent that the system resolution is diffraction limited rather than aberration limited.

It is also an object to locate the mask on the back side of a glass plate which is part of the lens system but is changed with each mask.

The foregoing and other objects, features and advantages of the invention will be more apparent from the following more particular description of the preferred embodiments of the invention as illustrated in the accompanying drawings.

BRIEF DESCRIPTION OF THE DRAWINGS

FIGS. 3A and 3B are end and side views of the block 50 of FIG. 2 showing the available field and possible folding planes.

FIGS. 4A, 4B, 4C and 4D are side, back, top and bottom views of a block 50 modified into two prisms and illustrating the modified object and image fields.

DESCRIPTION OF THE PREFERRED EMBODIMENTS

Figure 1:
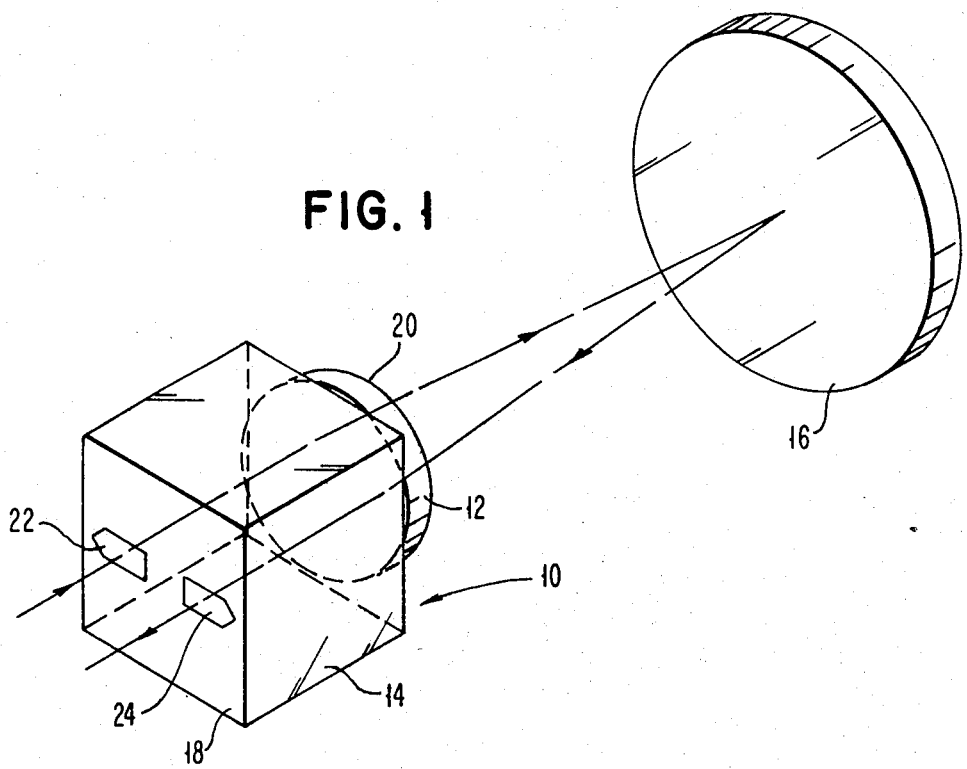
FIG. 1 is a view in perspective of a prior art basic Dyson system.

FIG. 1 illustrates the basic Dyson system. A thick plano-convex lens 10 comprising a thin plano-convex lens 12 cemented to a glass block 14 is concentric with a concave spherical mirror 16. The rear plane surface 18 of the lens 10 passes through the effective center of curvature of both the mirror 16 and the lens front surface 20 concentric therewith. Thus, the rear surface 18 is imaged inverted onto itself. An object 22 on one half of this surface forms an inverted image 24 on the other half of the surface.

Figure 2:
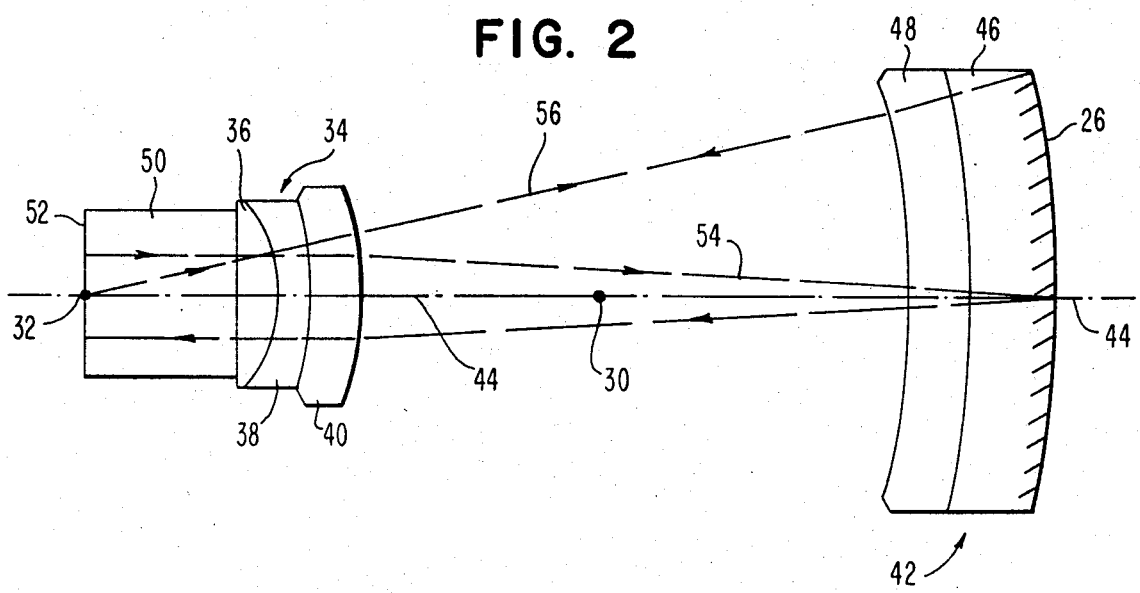
FIG. 2 shows the present invention in simplified form.

FIG. 2 illustrates the present invention in a form similar to the Dyson system. Mirror surface 26 defines an optical axis 44, a focal point 30 and a center of curvature 32 in close proximity to surface 52. A first refractory element 34 optically coaxial with axis 44 and located between the focal point 30 and center of curvature 32 comprises a plano-convex lens element 36 and meniscus lens elements 38 and 40. A second refractory element 42 optically coaxial with axis 44 and located between the focal point 30 and the vertex 28 of mirror surface 26 comprises meniscus lens elements 46 and 48. An optical block 50 defines a rear surface 52 which is parallel to the object and image planes nearby. The object and image planes are located at a position along the axis 44 such that object and image rays travel substantially symmetrically with respect to each other through the first and second refractory elements 34, 42. This occurs only when there is substantially unit magnification which happens when surface 52 is very close to or intersects the center of curvature 32. The principle ray 54 is the ray comming from a point at the extreme of the object field and passing through the vertex 28 of the mirror. The marginal ray 56 is the ray coming from a point 32 on the axis 44 and just passing the stop which establishes the numerical aperture. The stop here is effectively at the edge of the mirror surface 26.

By suitable choices of glasses and spherical surface radii for the elements 36, 38, 40, 46 and 48, optical aberrations may be corrected to so well an extent that the system becomes diffraction limited over a wide frequency spectrum. Refractory element 34 may theoretically comprise as few as two lens elements or even more than the three lens elements shown. The lens elements of refractory element 34 may be in full contact as shown or may contact each other only at the axis, at the edge or not at all depending upon the lens design. Refractory element 42 must have at least one spherical surface other than the mirror surface 26. This can be accomplished theoretically with as little as one meniscus lens. A solution may be found more easily if the meniscus lens is spaced from the mirror so that the back surface of the meniscus lens can have a radius different from the mirror surface 26. Preferably the first refractive element should be as close to the object and image planes as is practical and the second refractive element should be as close to the mirror as practical. The preferred technique for making a suitable selection of glasses and radii will be described in detail below with reference to FIG. 6. Briefly, the technique is to select the lens parameters of the first refractive element with the aim of reducing as much as possible the longitudinal chromatic aberration of the principal rays and to select the lens parameters of the second refractive element with the aim of reducing as much as possible the residual longitudinal chromatic aberration of the marginal rays.

In FIG. 2, as in the basic Dyson system, rear surface 52 is imaged inverted on itself with unit magnification. An object on one half of this surface is imaged inverted on the other half. As in the Dyson system, block 50 may contain a beam-splitting diagonal semi-reflecting surface to enable the object and image planes to be separated without sacrificing field size. This is taught more clearly in said U.S. Pat. No. 3,536,380 and the Wynne article described above. The beam-splitting technique is not preferred because only 33% of the light travels in the desired direction each time, so that only 11% (0.33×0.33) of the object light is available to form the image, neglecting other losses. Dielectric coatings would improve transmission but would also introduce detrimental chromatic effects.

The preferred technique for separating the object and image planes will now be described with reference to FIGS. 3 and 4. Circle 58 represents the total field which is ordinarily available at the numerical aperture chosen. Without a beam-splitting surface, half 60 of this circle 58 is ordinarily available as the object field and half 62 is ordinarily available as the image field. Upward pointing arrow 64 is shown as an object and downward point arrow 66 is the resulting image thereof. The separation between rear surface 52 and the object and image is exaggerated. In FIG. 4A, block 50 has been effectively cut along 45° diagonal surfaces 68, 70 (FIG. 3B) and extended in the upward and downward directions to form two prism structures which provide the same path length to retain optical correction. In the two dimension representation of FIG. 4A, what has occurred is that the dotted potions have been folded upward and downward, respectively, along lines 68 and 70. The previously defined half fields 60 and 62 now appear on the top (FIG. 4C) and the bottom (FIG. 4D) respectively. As shown in FIG. 4A, the cone of rays from the rear end of object arrow 64 is not complete anymore. A complete cone of rays is reflected by surface 68 of the top prism structure only over a much narrower object field, which now corresponds to approximately the arrowhead of arrow 64. Complete cones of rays are reflected from points in the half field 60 which lie to the left of line 72 (FIG. 4C). Thus, the object field still available is the shaded cord segment 74 shown in FIG. 4C. For scanning operation a stop 86 (FIG. 5) is provided that limits the field to a rectangular shape 76 having hexagonal ends as shown in FIG. 4D. The hexagonal end portions provide for more uniform illumination in butting areas during scanning operation. In order to obtain parity between the object plane and the image plane, one of the prisms may be a roof or Amici prism, shown in FIG. 4 as the lower prism. When parity exist as in this situation, the object and image may be moved together in the same direction within their planes with respect to the optical system and scanning is facilitated. Thus a mask much larger than the useful object field 74 may be projected upon a wafer of corresponding large size by moving the entire optical system in a scanning motion with respect to the mask and wafer, which are maintained in fixed positions relative to each other.

Figure 5:
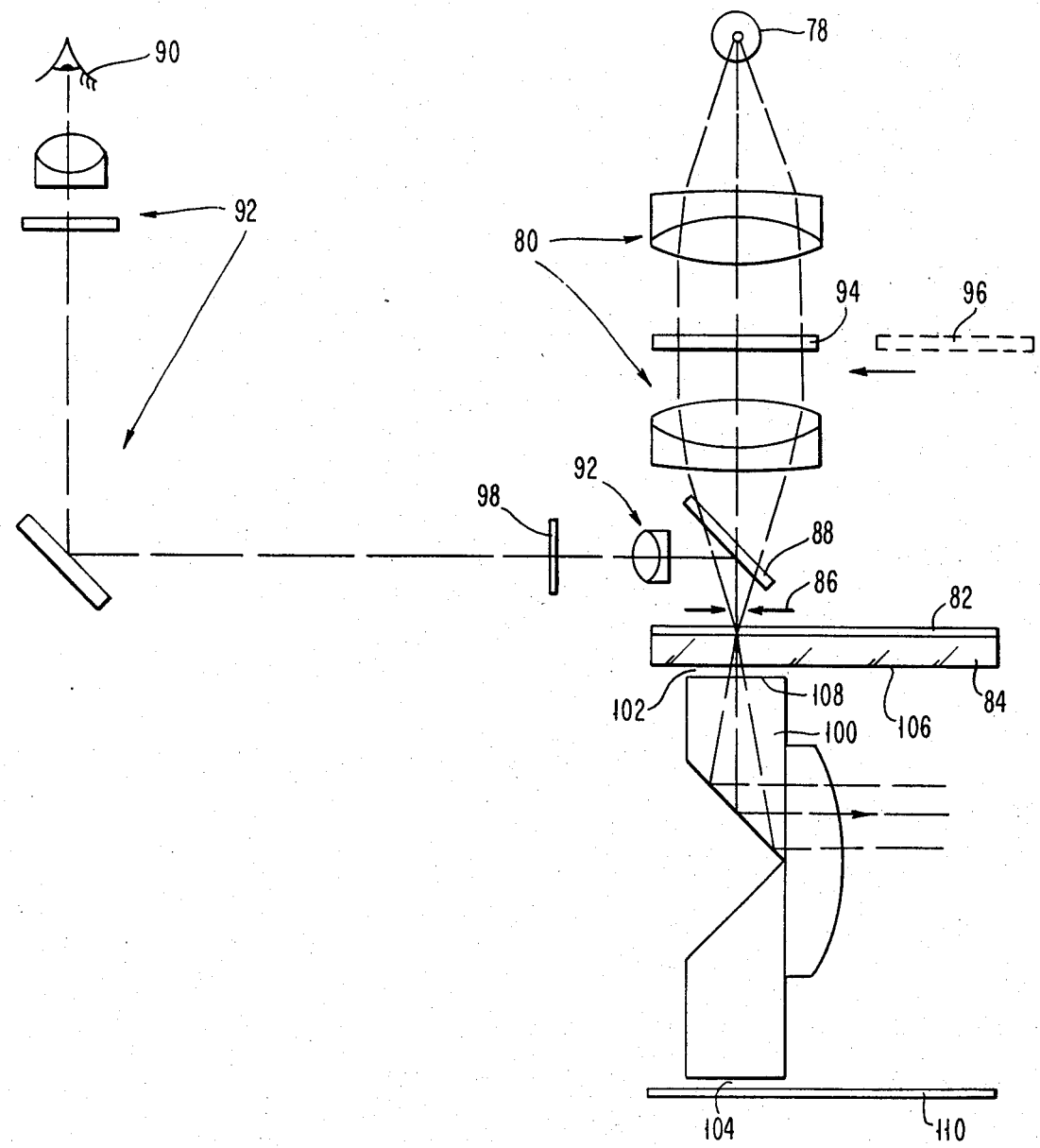
FIG. 5 illustrates illumination and alignment viewing systems as well as the preferred mask cover plate configuration.

The illumination and alignment optical systems are illustrated in FIG. 5. A capillary arc lamp 78 is imaged by condensing system 80 onto the mask 82 which is this embodiment is supported by a glass cover plate 84. The illumination is of critical type with a field stop 86 in close proximity to the mask and defining the object field format. As previously described a rectangular field is preferred with hexagonal ends as shown on the image side in FIG. 4D. The illumination passes through a semi-reflecting surface 88 so that the optical system may be simultaneously viewed by eye 90 through a folded microscope 92. For exposure, a near UV passing filter 94 is placed as shown. For alignment, the UV filter is replaced by a green light passing filter 96. An opaque stop 98 is inserted into the microscope branch during exposure to prevent stray light from entering the system.

Cover plate 84 which supports an object such as a mask 82 is an optical part of the optical system. In order to retain the same path length, prism 100 is shortened by an amount optically equivalent to the thickness of the plate 84. At the same time the air spaces 102 and 104 are maintained equal to retain optical symmetry and chromatic correction of aberrations. Surfaces 106 and 108 are thus brought out of focus so that dirt and scratches on these surfaces do not get imaged in focus onto the wafer 110.

Figure 6A:
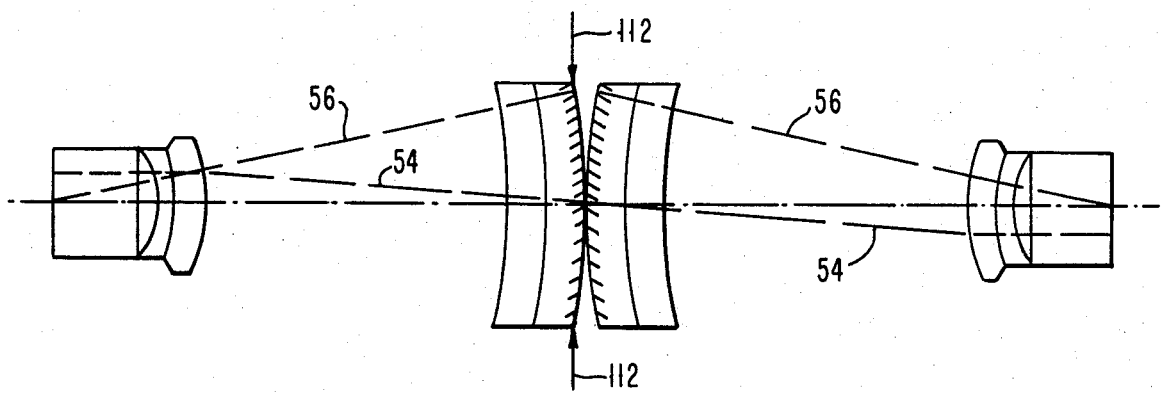
FIGS. 6A and 6B illustrate folded out actual and complementary forms of FIG. 2 for purpose of determining optical parameters of the system.

In FIG. 6A the system shown in FIG. 2 is folded out in a mirror image fashion to illustrate the preferred method of chromatic correction. The principal ray 54 and the marginal ray 56 are shown as well as the stop 112. As is apparent, the principle ray travels symmetrically (half above the axis and half below the axis) while the marginal ray does not. As a result, the chromatic aberration introduced to the principal ray in the left half of the system is automatically compensated for by the chromatic aberration introduced to this ray by the right half of the system. Chromatic aberration introduced to the marginal ray is additive because the marginal ray does not travel symmetrically (it stays above the axis). Ordinarily, the chromatic aberration to the marginal ray (which is longitudinal chromatic aberration by definition) is corrected in refractory element 34 while nothing is done about the chromatic aberration introduced to and then removed by the symmetry from the principle ray.

Figure 6B:
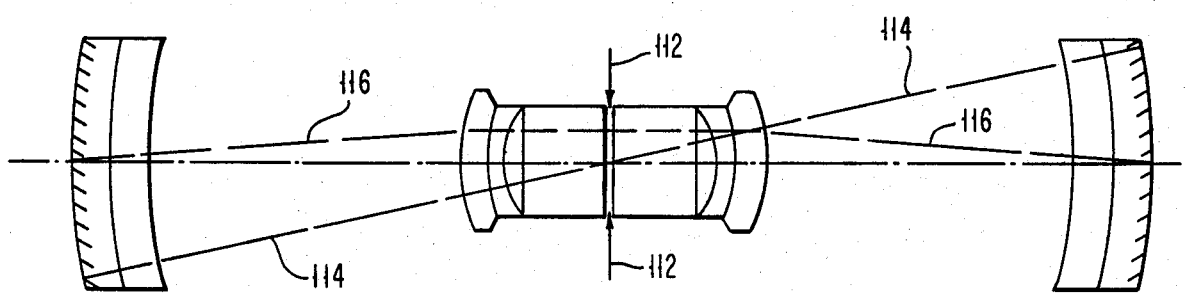

In FIG. 6B the system of FIG. 2 is shown operating in complementary fashion and again folded out. Now the mirror becomes the object instead of the rear surface of the glass block and the mirror is imaged on the right by the same system optically operating in complementary fashion. The stop 112 now moves from the mirror to the rear surface of the glass block as shown. By this artifice the new principle ray 114 now corresponds to the marginal ray 56 of FIG. 6A and the new marginal ray 116 now corresponds to the principal ray 54 of FIG. 6A. Now the ray 116 which was previously symmetrical and the chromatic aberration introduced by refractive element 34 becomes additive. The parameters for element 34 are now selected and calculated in conventional classical manner to correct the chromatic aberration of ray 116 by reference to the configuration of FIG. 6B. Since ray 114 is symmetrical, no correction is made here for chromatic aberration of this ray. With respect to FIG. 6B the chromatic correction made by refractory element 34 is a longitudinal chromatic correction and it is made with respect to the ray 116 which corresponds to the original principle ray. When the classical computations have been made and the glasses and radii for the refractive element 34 chosen to make this chromatic correction (as well as a correction for spherical aberration of course), reference shifts to the configuration shown in FIG. 6A for calculation of the parameters for refractive element 42. Now the parameters for element 42 are selected and calculated in conventional classical manner to correct the chromatic aberration of ray 56. Since ray 54 is symmetrical, no correction is made here for chromatic aberration of this ray. With respect to FIG. 6A the chromatic correction made by refractory element 42 is again a longitudinal chromatic correction and it is made with respect to the marginal ray. If necessary, the above process can be repeated to obtain finer correction. That is, element 34 parameters may be reselected and re-calculated again with reference to the system of FIG. 6B in which the previously determined parameters for element 42 are now used. The parameters for element 42 can be re-selected and re-calculated again in similar manner.

Figure 7:
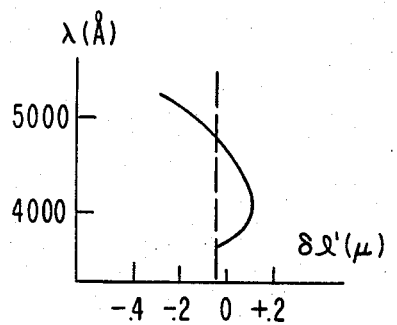
FIG. 7 shows the residual longitudinal spectrum of a specific example of the present invention.
Figures 8A, 8B, 8C, 8D, 8E:
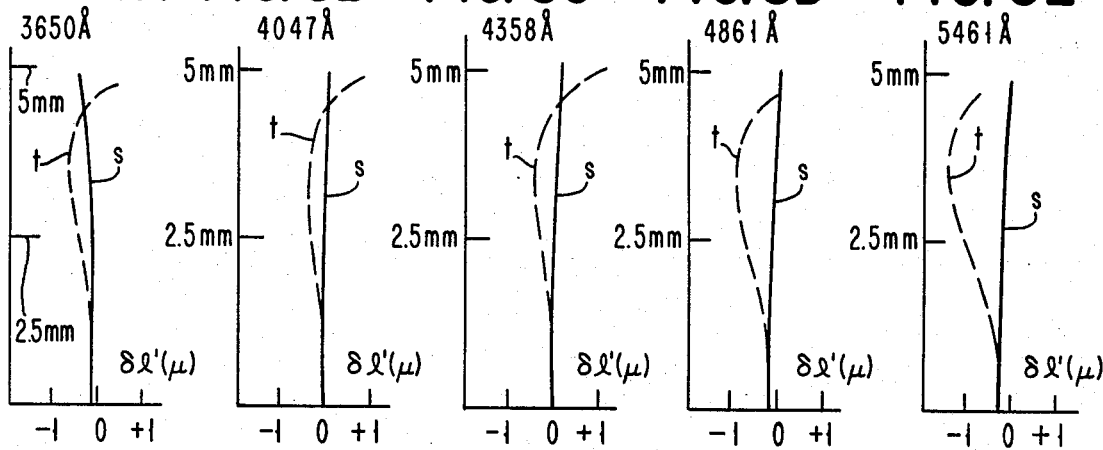
FIGS. 8A, 8B, 8C, 8D and 8E show the residual variations of astigmatism for the specific example at five specific wavelengths.
Figure 9:
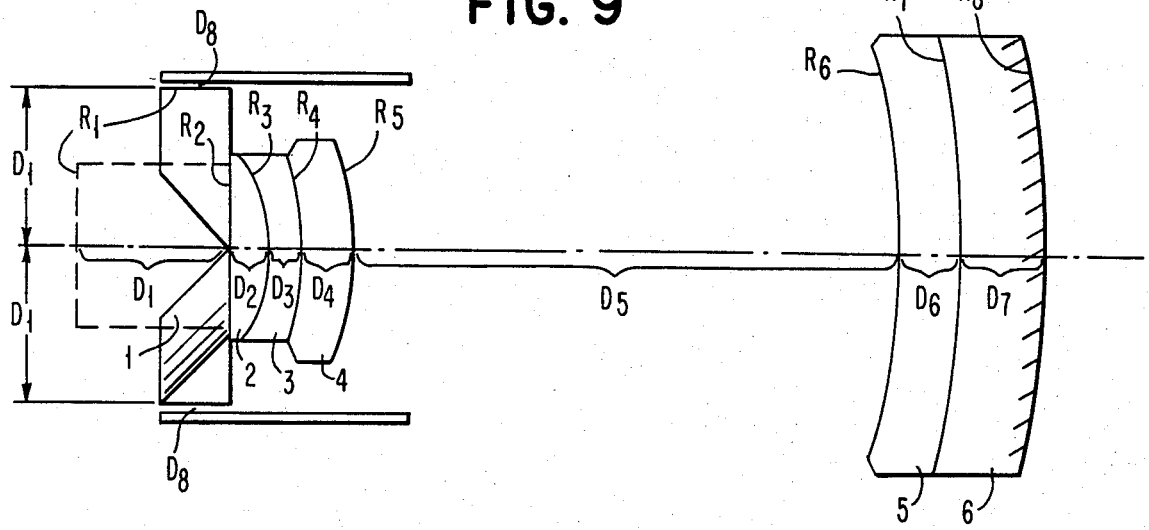
FIG. 9 defines the optical parameters of the specific example.

A preferred system has been designed in this manner and is illustrated in FIGS. 7–9. FIG. 8 shows the residual variations of astigmatism for five different wavelengths. FIG. 7 shows the residual longitudinal spectrum. Both residuals are but a fraction of the Rayleigh limit. FIG. 9 identifies the optical elements 1, 2, 3, 4, 5 and 6, defines the radii $R_1$ through $R_8$ as well as the dimensions $D_1$ through $D_8$ ($D_8$ is the thickness of the air space between the prisms and the mask or wafer). The following table lists the values for these dimensions as well as the respective indexes of refraction $N_D$, the reciprocal dispersion values V and the type of glass.

TABLE

| Radii (mm) | Thicknesses (mm) | Lens | $N_D$ | V | Glass Type |
|---|---|---|---|---|---|
| $R_1$ = plano | $D_1$ = 20.0 | 1 | 1.55663 | 58.6 | Bak-5 |
| $R_2$ = plano | $D_2$ = 5.0 | 2 | 1.52241 | 59.4 | K-5 |
| $R_3$ = 20.41 | $D_3$ = 4.3 | 3 | 1.60328 | 38.0 | F-5 |
| $R_4$ = 37.74 | $D_4$ = 6.8 | 4 | 1.58304 | 59.4 | SK-12 |
| $R_5$ = 37.88 | $D_5$ = 70.2 | 5 | 1.55663 | 58.6 | BaK-5 |
| $R_6$ = 108.57 | $D_6$ = 8.0 | 6 | 1.61989 | 36.3 | F-2 |
| $R_7$ = 125.73 | $D_7$ = 10.4 | | | | |
| $R_8$ = 125.05 | $D_8$ = .39 | | | | |

Figure 10:
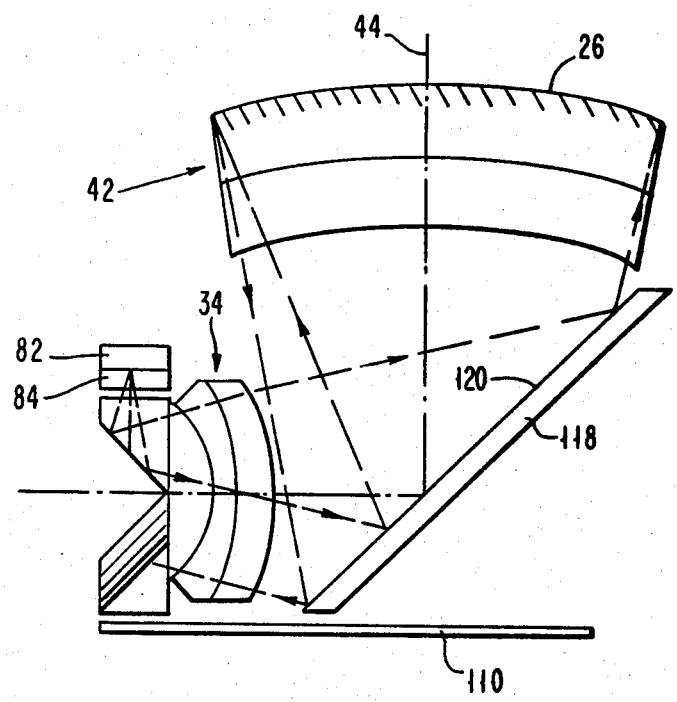
FIG. 10 illustrates another embodiment having an additional folding of the optical axis at the concave mirror.

FIG. 10 illustrates another embodiment wherein the optical axis 44 of the reflecting surface 26 has been folded upward between the first and second refractive elements 34, 42 by a plane mirror 118 having a planar reflecting surface 120. By folding the optical axis as shown a wafer 110 may extend to the right into a region otherwise occupied by the optical system. This type of configuration where the wafer is large and the mask is small as shown is typical for a step-and-repeat type application. A large wafer will interfere with the optics whenever the numerical aperture is sufficiently large (such as N.A.=0.40, for example).

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A unit magnification achromatic optical system comprising:
    a spherical concave reflecting surface defining an optical axis;
    a first refractory element optically coaxial with said reflecting surface and positioned between the focal point and center of curvature thereof;
    a second refractory element optically coaxial with said reflecting surface and positioned between said reflecting surface and the focal point thereof;
    means defining an object plane and an image plane such that object rays and image rays travel symmetrically with respect to each other through said first and second refractory elements, thereby forming a unit magnification system;
    said first refractory element optimally correcting longitudinal chromatic aberration of the principal rays; and
    said second refractory element correcting residual longitudinal chromatic aberration of the marginal rays.

2. An optical system as defined in claim 1 wherein said first refractory element comprises:
    a first plano-convex lens element;
    a second meniscus lens element coaxial with said first lens element and sharing a central common surface area therewith; and
    a third meniscus lens element coaxial with said second lens element and sharing a central common surface area therewith.

3. An optical system as defined in claim 2 wherein said second refractory element comprises:
    a fourth meniscus lens element coaxial with said reflecting surface, a central convex surface area of said fourth lens element coinciding with a central surface area of said reflecting surface; and
    a fifth meniscus lens element coaxial with said fourth lens element, a central convex surface area of said fifth lens element coinciding with a central concave surface area of said fourth lens element.

4. An optical system as defined in claim 3 wherein said means defining an object plane and an image plane comprises an optical element having no curved optical surfaces.

5. An optical system as defined in claim 4 wherein said optical element comprises a block of optically transparent material having a first planar surface area in common with a central planar surface area of said plano-convex lens element and having a second planar surface area parallel with and opposed to said first planar surface area, said second planar surface area being in close proximity with the center of curvature of said reflecting surface.

6. An optical system as defined in claim 4 wherein said optical element comprises first and second prism elements defining object and image planes having a common optical axis perpendicular with the geometrical axis of said reflecting surface.

7. An optical system as defined in claim 6 wherein one of said prism elements is an Amici prism, so as to obtain parity between said object and image planes.

8. An optical system as defined in claim 6 wherein one of said prism elements has an optical path length which is less than the optical path length of the other of said prisms for use with an optically transparent object supporting plate having a thickness equal to the difference between said optical path lengths.

9. An optical system as defined in claim 1 wherein said means defining an object plane and an image plane comprises an optical element having no curved optical surfaces.

10. An optical system as defined in claim 9 wherein said optical element comprises first and second prism elements defining object and image planes having a common optical axis perpendicular with the grometrical axis of said reflecting surface.

11. An optical system as defined in claim 10 wherein one of said prism elements is an Amici prism, so as to obtain parity between said object and image planes.

12. An optical system as defined in claim 10 wherein one of said prism elements has an optical length which is less than the optical path length of the other of said prisms for use with an optically transparent object supporting plate having a thickness equal to the difference between said optical path lengths.

* * * * *